United States Patent [19]

Mathad et al.

[11] Patent Number: 5,258,264
[45] Date of Patent: Nov. 2, 1993

[54] PROCESS OF FORMING A DUAL OVERHANG COLLIMATED LIFT-OFF STENCIL WITH SUBSEQUENT METAL DEPOSITION

[75] Inventors: Gangadhara S. Mathad, Poughkeepsie; David Stanasolovich, Ithaca, both of N.Y.; Giorgio G. Via, McLean, Va.

[73] Assignee: International Business Machines Corporatton, Armonk, N.Y.

[21] Appl. No.: 926,659

[22] Filed: Aug. 6, 1992

Related U.S. Application Data

[60] Continuation of Ser. No. 665,372, Mar. 6, 1991, abandoned, which is a division of Ser. No. 350,182, Jul. 6, 1989, Pat. No. 5,024,896.

[51] Int. Cl.$^5$ ............................. G03F 7/36; G03F 7/42
[52] U.S. Cl. ........................................ 430/315; 430/313;
430/317; 430/324; 427/96; 427/534; 156/643;
156/646; 156/652; 156/653; 156/655;
204/192.36
[58] Field of Search ............... 430/313, 314, 316, 317,
430/323, 324; 156/643, 652, 655, 653; 204/165,
192.34, 192.36; 427/96, 99, 41

[56] References Cited

U.S. PATENT DOCUMENTS

| | | | |
|---|---|---|---|
| 4,519,872 | 5/1985 | Anderson, Jr. et al. | 430/317 |
| 4,562,091 | 12/1985 | Sachdev et al. | 204/165 |
| 4,599,243 | 7/1986 | Sachdev et al. | 430/314 |
| 4,606,931 | 8/1986 | Olsen et al. | 204/192.36 |
| 4,692,205 | 9/1987 | Sachdev et al. | 430/314 |
| 4,816,115 | 3/1989 | Hörner et al. | 430/316 |
| 5,024,896 | 6/1991 | Mathad et al. | 430/312 |

*Primary Examiner*—Charles L. Bowers, Jr.
*Assistant Examiner*—John S. Chu
*Attorney, Agent, or Firm*—Lauren C. Bruzzone; Jesse L. Abzug

[57] ABSTRACT

A process and structure for depositing metal lines in a lift-off process is disclosed. The process comprises the deposition of a four-layer structure or lift-off stencil, comprising a first layer of a lift-off polymer etchable in oxygen plasma, a first barrier layer of hexamethyldisilizane (HMDS) resistant to an oxygenplasma, a second lift-off layer and a second barrier layer. Once these layers are deposited, a layer of photoresist is deposited and lithographically defined with the metal conductor pattern desired. The layers are then sequentially etched with oxygen and $CF_4$, resulting in a dual overhang lift-off structure. Metal is then deposited by evaporation or sputtering through the lift-off structure. Following metal deposition, the stencil is lifted-off in a solvent such as N-methylpyrroldone (NMP).

14 Claims, 1 Drawing Sheet

PROCESS OF FORMING A DUAL OVERHANG COLLIMATED LIFT-OFF STENCIL WITH SUBSEQUENT METAL DEPOSITION

This is a continuation of application Ser. No. 07/665,372 filed Mar. 6, 1991, abandoned which is a division of application Ser. No. 07/350,182 filed Jul. 6, 1989, now U.S. Pat. No. 5,024,896.

BACKGROUND INFORMATION

1. Field of the Invention

This invention relates to a method and structure for depositing metal conductors on a substrate. In particular, a dual overhang, collimated metal process for depositing metal lines on a semiconductor chip is described.

2. Background Art

Current Very Large Scale Integrated (VLSI) circuits and Ultra Large Scale Integrated (ULSI) circuits require the deposition of metal interconnection lines less than one micron in width. Metal lift-off processes have been widely used for depositing narrow metal conductors in the prior art. The basic "lift-off" method is described in U.S. Pat. No. 2,559,389. Improvements to the basic lift-off method have been made, as for example in commonly assigned U.S. Pat. Nos. 3,849,136; 3,873,861 and 4,519,872.

The central concept of the lift-off method involves the deposition of a non-radiation sensitive lift-off layer, followed by the deposition of a thin-film of an inorganic material as a barrier layer. The desired metallurgy pattern is formed in a top resist layer using conventional lithographic techniques and etched into the barrier layer. The barrier layer functions as an etch barrier during subsequent reactive ion etching to form openings through the lift-off layer, extending to the substrate. Metal is then deposited, by sputtering or evaporation, for example. Following the metal deposition, immersion in a solvent dissolves or releases the base lift-off film, thereby leaving the metal conductors deposited in the windows.

One of the problems with this method is that commercial metal deposition tools do not allow the metal atoms to be deposited exclusively from a vertical direction. Metal ions that are sputtered or evaporated enter the lift-off stencil openings at various angles to the normal. This often results in undesired metal deposited along the inner walls of the lift-off structure, a problem known as "footing". While some footing is tolerable for line widths greater than one micron, it can lead to difficult lift-off and electrical shorts in the integrated circuit for line widths less than one micron.

OBJECTS OF THE INVENTION

It is an object of this invention to provide an improved metal lift-off process in which undesired footing is eliminated even when narrow lines and spacings are to be defined.

It is a further object of the invention to provide a collimated metal deposition method and structure in which a dual overhang structure is used to eliminate undesired metal deposition.

SUMMARY OF THE INVENTION

These and other objects of the invention are accomplished by the inventive process disclosed and claimed herein. The process comprises the deposition of a four-layer structure or lift-off stencil, comprising a first layer-of a lift-off polymer etchable in oxygen plasma, a first barrier layer of hexamethyldisilizane (HMDS) resistant to an oxygen plasma, a second lift-off layer, and a second barrier layer. Once these layers are deposited, a layer of photoresist is deposited and lithographically defined with the metal conductor pattern desired. The layers are then sequentially etched with oxygen and $CF_4$, resulting in a dual overhang lift-off structure. Metal is then deposited by evaporation or sputtering through the lift-off structure. Following metal deposition, the lift-off structure is dissolved or lifted-off in a solvent such as N-methylpyrrolidone (NMP).

DESCRIPTION OF THE PREFERRED EMBODIMENT

The process to be described below is based on similar principles as used in collimating a light beam, laser, X-ray beam, or other radiation sources. In such collimation systems, colinear apertures are arranged so that the radiation exiting the system has all of the rays essentially parallel to each other. This same phenomena can be applied to the deposition of metal in a lift-off process to "focus" the metal to be deposited in a narrow line.

Figure 1A:
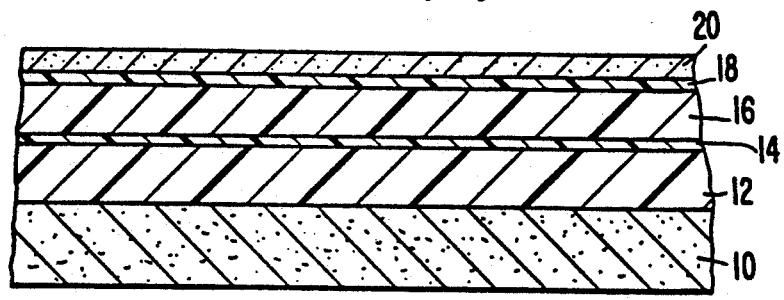
FIGS. 1A-C show a sequence of cross-sectional views of the lift-off process and structure during various stages of fabrication.

Referring to FIG. 1A, a substrate 10, such as a semiconductor wafer with integrated circuits formed therein (not shown) is coated with a polyimide layer 12. Coating can be accomplished by spinning in polyamic acid and curing to form polyimide. The polyimide layer 12 is etchable in a reactive ion etch (RIE) chamber using oxygen as the etch gas. The thickness of the polyimide should exceed the thickness of the desired metal line to be deposited in subsequent processing steps by approximately thirty percent. Alternatively, a layer of photoresist can be used as the lift-off layer 12 instead of polyimide. The thickness of the photoresist should be comparable to the polyimide thickness.

A barrier layer 14 of plasma polymerized HMDS is deposited to a thickness of approximately 2,000 Angstroms. The HMDS barrier layer 14 while not etchable in an oxygen plasma, is etchable in a plasma of a gas selected from a group of fluorocarbon (e.g., $CF_4$, $C_2F_6$, $CHF_3$) gases with or without oxygen as an additive. On this barrier layer 14 is deposited a second lift-off layer 16 which can be identical to the lift-off layer 12. The thickness should also be similar. On top of the lift-off layer 16 is deposited a second barrier layer 18 similar to layer 14. Barrier layers 14 and 18 can alternatively be $SiO_2$, $Si_3N_4$, resin glass or other inorganic materials.

The substrate 10 with the deposited layers or lift-off stencil is ready for patterning. A photoresist layer 20 having the desired radiation sensitivity is applied, exposed and developed using conventional photolithographic processes. The thickness of the photoresist layer is in the 0.5-1.0 micron range.

The entire stack is then etched in a 4 step etching sequence using the patterned photoresist layer 20 as a first etch mask. In the first RIE step, fluorocarbon gas such as $CF_4$, $CHF_3$, or $C_2F_6$, with or without $O_2$ as an additive are used as the etch gases. The power level, gas flow and pressure parameters are dependent upon the thickness of the layer 18 and the type of RIE reactor. With minimal experimentation, one skilled in the art can determine the etch parameters for all of the etching steps described herein. End point for the etching can be determined by laser interferometry, spectrophotometric analysis or other commonly used means.

In the second RIE step, $O_2$ alone or mixed with less than 2% of a fluorocarbon gas, is used to etch layer 16 in a vertical direction. This plasma alone will not significantly etch HMDS layer 18. The third RIE step to etch layer 14 is identical to the first etch step, and the fourth RIE step to etch layer 12 is identical to the second etch step.

Figure 1B:
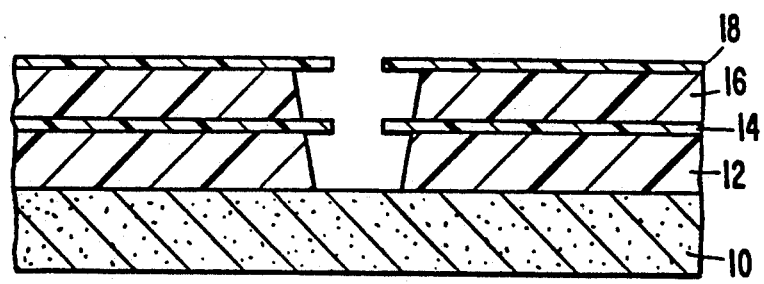

Following the completion of the 4th etching step, etching continues using oxygen and higher pressure or power such that the plasma will laterally etch the lift-off layers 16 and 12, resulting in the dual overhang HMDS structure as shown in FIG. 1B. Because the final structure has two overhangs (in layers 18 and 14), upon deposition of evaporated or sputtered metal, the polydirectional metal atoms are screened by the first overhang 18 and the aligned second overhang in layer 14. Thus, there is the equivalent of a light-beam collimator which, using two coaxial apertures, defines a precise geometrically defined beam of light.

Figure 1C:
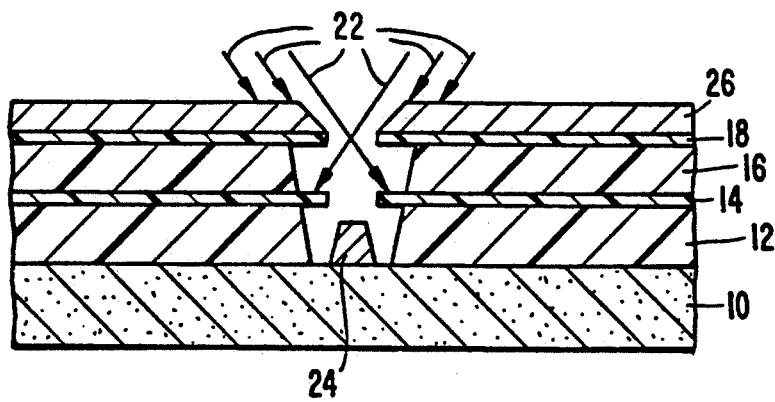

Referring to FIG. 1C, the arrows 22 depict the non-vertical paths of the metal atoms, which are prevented from reaching the surface of substrate 10 by the overhangs in layers 18 and 14. Metal is deposited using well-known sputtering or evaporation techniques known in the art.

The final structure, with the metal line 24 and excess metal 26 deposited on substrate 10 is shown in FIG. 3. Following deposition of the metal, the lift-off stencil and excess metal 26 is lifted-off in a solvent such as NMP.

While the invention has been shown and described with reference to a preferred embodiment, it would be obvious to one skilled in the art that suitable modifications and alternatives can be made without departing from the spirit and scope of the invention. Accordingly, the invention should be limited only as specified in the following claims.

We claim:

1. A process for depositing metal conductors on a substrate using a dual overhang collimated lift-off stencil comprising the following steps in the following order:
   providing a substrate;
   depositing a first lift-off layer on said substrate;
   depositing a first barrier layer on said first lift-off layer;
   depositing a second lift-off layer on said first barrier layer, said first lift-off layer and said second lift-off layer both being soluble to a release solvent;
   depositing a second barrier layer on said second lift-off layer;
   depositing a radiation sensitive polymeric layer on said second barrier layer;
   lithographically defining a pattern of lines in said radiation sensitive polymeric layer;
   performing a first etching of said pattern into said second barrier layer using a first etch gas;
   performing a second etching of said pattern into said second lift-off layer using a second etch gas;
   performing a third etching of said pattern into said first barrier layer using said first etch gas;
   performing a fourth etching of said pattern into said first lift-off layer using said second etch gas;
   said materials of said first lift-off layer, said second lift-off layer, said first barrier layer and said second barrier layer being chosen so that the result of said first etching, said second etching, said third etching and said fourth etching is that said second barrier layer, has edges which overhang said second lift-off layer and said first barrier layer has edges which overhang said first lift-off layer;
   depositing metal conductors on said substrate; and
   lifting-off said first lift-off layer, said first barrier layer, said second lift-off layer and said second barrier layer and excess metal using said release solvent.

2. The process as claimed in claim 1 wherein said first barrier layer is selected from the group consisting of HMDS, $SiO_2$, $Si_3N_4$, and resin glass.

3. The process as claimed in claim 1 wherein said second barrier layer is selected from the group consisting of HMDS, $SiO_2$, $Si_3N_4$, and resin glass.

4. The process as claimed in claim 1 wherein said first lift-off layer is photoresist.

5. The process as claimed in claim 1 wherein said second lift-off layer is photoresist and is the same as said first lift-off layer.

6. The process as claimed in claim 1 wherein the etching of the lift-off layer is performed using $O_2$ or $O_2$ containing plasma.

7. The process as claimed in claim 1 wherein the etching of the barrier layers is performed using a plasma of gas selected from the group consisting of $CF_4$, $C_2F_6$, or $CHF_3$, with or without $O_2$ as an additive.

8. A process for depositing metal conductors on a substrate using a dual overhang collimated lift-off stencil comprising the following steps in the following order:
   providing a substrate;
   depositing a first lift-off layer on said substrate;
   depositing a first barrier layer on said first lift-off layer;
   depositing a second lift-off layer on said first barrier layer;
   depositing a second barrier layer on said second lift-off layer;
   depositing a radiation sensitive polymeric layer on said second barrier layer;
   lithographically defining a pattern of lines in said radiation sensitive polymer layer;
   performing a first etching of said pattern into said second barrier layer using a first etch gas;
   performing a second etching of said pattern into said second lift-off layer using a second etch gas;
   performing a third etching of said pattern into said first barrier layer using said first etch gas;
   performing a fourth etching of said pattern into said first lift-off layer using said second etch gas;
   performing a further etching wherein said first lift-off layer and said second lift-off layer are laterally etched, resulting in a dual overhang lift-off structure;
   depositing metal conductors on said substrate; and
   lifting-off said layer and excess metal in a release solvent.

9. The process as claimed in claim 8 wherein said first barrier layer is selected from the group consisting of HMDS, $SiO_2$, $Si_3N_4$, and resin glass.

10. The process as claimed in claim 8 wherein said second barrier layer is selected from the group consisting of HMDS, $SiO_2$, $Si_3N_4$, and resin glass.

11. The process as claimed in claim 8 wherein said first lift-off is photoresist.

12. The process as claimed in claim 8 wheein said second lift-off layer is photoresist.

13. The process as claimed in claim 8 wherein the etching of the lift-off layer is performed using $O_2$ or $O_2$ containing plasma.

14. The process as claimed in claim 8 wherein the etching of the barrier layer is performed using a plasma of gas selected from the group consisting of $CF_4$, $C_2F_6$, or $CHF_3$, with or without $O_2$ as an additive.

* * * * *